United States Patent
Yamamoto et al.

[11] Patent Number: 6,137,121
[45] Date of Patent: Oct. 24, 2000

[54] INTEGRATED SEMICONDUCTOR LIGHT GENERATING AND DETECTING DEVICE

[75] Inventors: Yousuke Yamamoto; Yoshikazu Tanaka; Seiichi Nagai; Mitsuo Ishii; Isao Oshima; Kazuyoshi Hasegawa, all of Tokyo, Japan

[73] Assignee: Mitsubishi Denki Kabushiki Kaisha, Tokyo, Japan

[21] Appl. No.: 09/104,968

[22] Filed: Jun. 26, 1998

[30] Foreign Application Priority Data

Oct. 1, 1997 [JP] Japan .................................. 9-268593
Oct. 21, 1997 [JP] Japan .................................. 9-288412

[51] Int. Cl.[7] ........................ H01L 33/00; H01L 31/0232
[52] U.S. Cl. ............................. 257/80; 257/81; 257/98; 257/99; 257/432; 257/433
[58] Field of Search ............................. 257/80, 81, 82, 257/98, 99, 432, 433

[56] References Cited

U.S. PATENT DOCUMENTS 5,608,233  3/1997  Sahara et al. ........................... 257/80

FOREIGN PATENT DOCUMENTS 57-42004  3/1982  Japan .
964478   3/1997  Japan .

OTHER PUBLICATIONS

Yoshikawa et al., "Laser–Detector–Hologram Unit For Thin Optical Pick–up Head Of A CD Player", IEEE Transactions on Components, Packaging, and Manufacturing Technology, Part B, vol. 18, No. 2, May 1995, pp. 245–249.

*Primary Examiner*—Minh Loan Tran
*Attorney, Agent, or Firm*—Leydig, Voit & Mayer, Ltd.

[57] ABSTRACT

An optical semiconductor device used for optical information processing, such as writing information into and reading information from an optical disk. The optical semiconductor device includes a Si substrate, a light emitting element, and a reflector for reflecting light emitted from the light emitting element in a direction perpendicular to the mounting surface of the Si substrate. The reflector has a reflecting surface inclined by 45° from a bottom face and formed by etching a single crystal of Si.

12 Claims, 13 Drawing Sheets

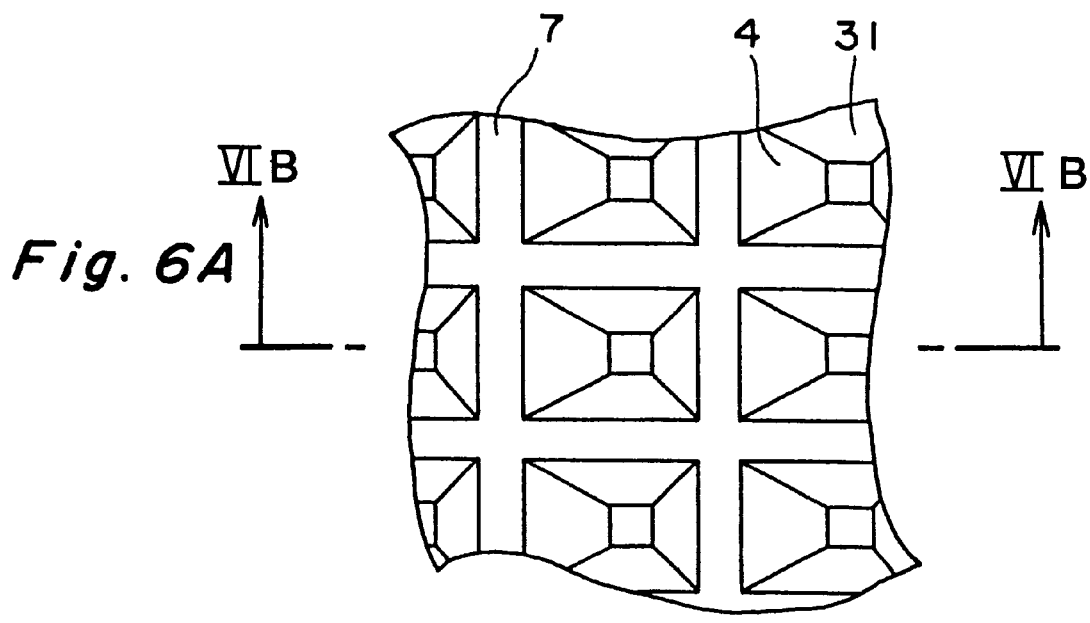
Fig. 6A
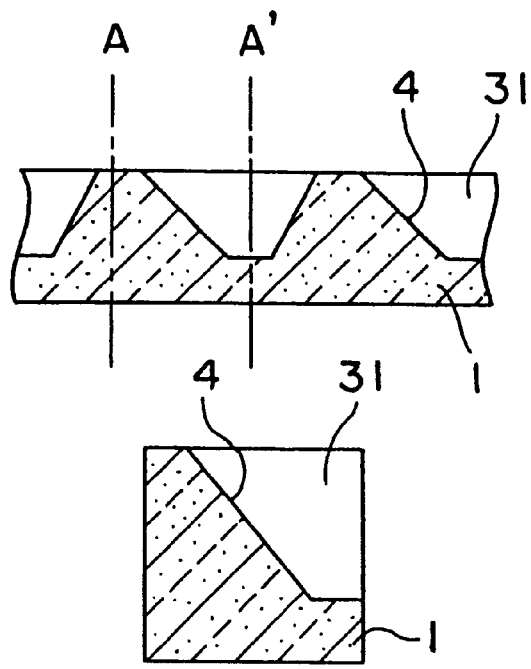
Fig. 6B
Fig. 6C
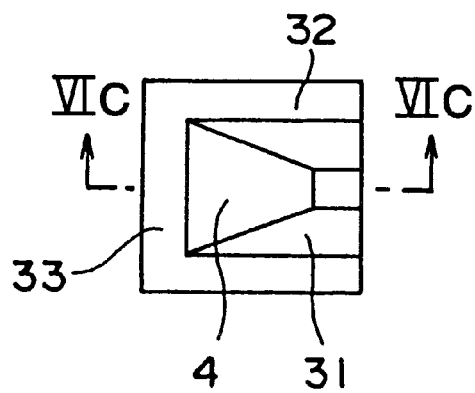
Fig. 6D

INTEGRATED SEMICONDUCTOR LIGHT GENERATING AND DETECTING DEVICE

BACKGROUND OF THE INVENTION

1. Field of the Invention

The present invention relates to an optical semiconductor device including a reflector. More particularly, it relates to an optical semiconductor device used for optical information processing such as writing information onto and reading information from optical disks.

2. Description of the Related Art

FIGS. 12A and 12B are a sectional view and a top view, respectively, of an optical semiconductor device of the conventional configuration described in IEEE Transactions on Components, "Packing and Manufacturing Technology" Part B, Vol.18, No.2, May 1995, pp.245–249. In the drawing, numeral 2 denotes a laser diode (LD) or light emitting device, 4 denotes a reflecting surface, 5 denotes a photodiode (PD) or light detecting device, 61 denotes an Si substrate and 66 denotes a groove.

In such an optical semiconductor device, light emitted from the light emitting element 2, mounted on the Si substrate 61, in a direction parallel to the surface of the Si substrate 61 is reflected by the reflecting surface 4 in a direction perpendicular to the surface of the Si substrate 61. The reflected light is directed onto an optical disk or the like (not shown), is then split by a hologram, and detected as a reflected optical signal by the light detecting element 5 on the Si substrate 61.

Thus, the light reflected by the reflecting surface 4 must be directed exactly at right angles to the Si substrate 61. Therefore, conventionally, the Si substrate 61 has been subjected to etching with KOH or the like and the Si substrate has a surface deviating from a (100) plane of the monocrystalline Si substrate by an angle, referred to here as an off-angle, for example, by 9.7°. The etching forms the groove 66 having a side face lying in a (111) plane of the monocrystalline Si substrate 61. The (111) plane forms an angle of 45° with the surface of the Si substrate 61 so the (111) plane is used as the reflecting surface 4. Thus, the light emitted from the light emitting element 2, mounted on an etched bottom face, of the groove 66 parallel to the surface of the Si substrate, is reflected by the reflecting surface 4 in a direction perpendicular to the surface of the Si substrate.

However, since the light detecting device 5 is present in the Si substrate 61 before the groove 66 is formed by etching, it is necessary to protect the light detecting device 5 during the etching to form the groove 66. When $SiO_2$ is used as a protective film that has a high resistance to etching by KOH or the like, the $SiO_2$ film cannot be distinguished from an $SiO_2$ passivation film on the light detecting device that has previously been formed on the Si substrate 61. Thus, it is difficult to selectively remove only the protective film after forming the groove 66 by etching.

A heat treatment step in forming the light detecting element 5 is usually carried out at a temperature of around 1000° C. However, keeping the Si substrate 61 at such a high temperature causes crystalline defects to segregate, eventually resulting in a problem, for example, the reflecting surface 4 formed by etching may become rough.

Moreover, in photolithography, after forming the groove 66, the step in the groove 66 prevents a resist film on the Si substrate 61 from being planar, decreasing accuracy in forming the resist pattern.

To counter such problems, Japanese Patent Kokai Publication No. 9-64478 discloses an optical semiconductor device with a through hole in an Si substrate. A laser chip generating heat is mounted on a sub-mount fixed on a heat dissipation plate in the through hole. Thereby, the heat dissipation performance is improved. Light emitted by the laser chip is reflected in a direction perpendicular to the Si substrate surface by a mirror specifically installed on the Si substrate, not by a reflector formed by etching the Si substrate. However, such a configuration requires making the through hole in the Si substrate and installing the sub-mount, making production more complex, and also requires the laser chip to be fixed on the sub-mount with high accuracy, making the configuration unsuitable for mass production. Moreover, because the configuration has the through hole in the Si substrate, it is impossible to employ photolithography in which the Si substrate surface is coated with a resist film.

The present inventors have found that desirable light emitting characteristics can be obtained from a light emitting element having a low power output, up to 10 mW, or having a characteristic temperature, $T_0$, of 90°K or higher, even when the light emitting element is mounted directly on the Si substrate and also found that, by mounting a light emitting element and a reflector formed separately from the Si substrate on the Si substrate, it is possible to form an optical semiconductor device in which light emitted by the light emitting element is reflected in a direction perpendicular to the Si substrate surface, without etching the Si substrate with the light emitting element already mounted on the substrate as in the prior art.

FIG. 13 is a sectional view of an another optical semiconductor device of the conventional configuration. The light detecting diode 42 for reprocessing, tracking, or focusing signals or the like, and the reflecting surface 43 inclined at an angle of 45° from the surface of the Si device substrate 100 are fabricated in the Si device substrate. The light emitting element 44, a source of light, is mounted on the Si device substrate 100, and the Si device substrate 100 is fixed in the package 45.

In such an optical semiconductor device, light emitted from the light emitting element 44 is reflected by the reflecting surface 43 in a direction perpendicular to the surface of the Si device substrate 100, and the reflected light is directed onto an optical disk or the like (not shown) through the hologram 46 and a lens or the like. Then the light reflected from the optical disk is split by the hologram 46, and directed onto the light detecting element 42 for reprocessing, tracking, or focusing the light, and recognized as a signal.

A uniform distribution of the light intensity on the reflecting surface 43 is needed in order to prevent an error in processing the light signal. Therefore, flatness of the reflecting surface is needed. Namely, the roughness of the reflecting surface 43 should be about 1% of the wavelength (for example, 650 nm for red light).

However, it is difficult to control the roughness of the reflecting surface 43 to about 1% of the wavelength using wet etching. Particularly, when the Si device substrate 100 has defects or the like in it, the roughness of the reflecting surface is increased because of the defects.

To counter such problems, Japanese Patent Kokai Publication No. 9-64478 discloses a optical semiconductor device with a Si reflector which has a reflecting surface fabricated by mechanical polishing and having an angle of 45° from the bottom face. However it is difficult to fabricate such a reflecting surface having an angle of exactly 45° from the bottom face by mechanical polishing, and it is difficult to fabricate such an optical semiconductor in mass-production.

SUMMARY OF THE INVENTION

Hence, an object of the present invention is to solve the problems described above arising from the use of a reflector in the groove made by etching a Si substrate, and to provide an optical semiconductor device which uses a reflector formed by etching a single crystal of Si and has excellent properties suited to mass production.

Another object of the present invention is to solve the problem of the roughness of the reflecting surface of the optical semiconductor device, and to provide a Si single crystal reflector having a flat reflecting surface, and an optical semiconductor device, using this reflector.

The present inventors have found that the above object can be achieved by mounting a light emitting element and a reflector, which reflects light emitted by the light emitting element in a direction perpendicular to an Si substrate surface, on the Si substrate where the light emitting element is located, to produce an optical semiconductor device and have found that the object could be achieved with this configuration.

The present inventors have found that above object can be achieved using a reflector which has a polished flat surface of a Si single crystal substrate, and an etched bottom face having an angle of 45° from the surface, whereby a uniform distribution of light intensity reflected by the reflector can be obtained using the surface of the Si substrate as a reflecting surface. Thus, the present invention has been completed.

The present invention provides a reflector made of a Si single crystal comprising a bottom face and a {111} plane reflecting surface formed by etching and inclined by an angle of 45° from the bottom face.

Use of a reflector which has a reflecting surface inclined by 45° from the bottom face and formed separately from the Si substrate, as described above, makes it unnecessary to form the reflecting surface by etching the Si substrate as in the prior art, and eliminates the need for the protection of a light detecting element already on the Si substrate. Because no groove is formed, the Si substrate has a flat surface which makes it possible to carry out photolithography with high accuracy. Moreover, because both the light emitting element and the reflector are fixed on the flat Si substrate surface, alignment is relatively easy.

Etching the single crystal substrate of Si under properly selected etching conditions makes it possible to form a reflector with a {111} plane having a reflecting surface inclined by 45° from the bottom face of mirror quality, thereby making the manufacture of the reflector more accurate and easier.

The reflector may have a stepped face parallel to the bottom face and adjacent to the reflecting surface. Because the reflector has a stepped face, the reflector can be fixed on the Si substrate after aligning the light emitting element with the reflector and after fixing the light emitting element to the stepped face, making it possible to carry out the aligning easier. The reflector may have a top face which has a planar C-shape and is parallel to the bottom face, the reflecting surface formed by etching adjoining the inner edge of the top face and two etched side faces adjacent to opposite sides of the reflecting surface. Because the reflecting surface has two etched side faces adjacent to opposite sides of the reflecting surface, the stepped portion which would otherwise be formed on the reflecting surface, depending on the etching conditions in etching the reflecting surface, is formed on the etched side face adjacent to the reflecting surface, thereby forming a reflecting surface having excellent planarity, without a step.

The reflector may also be a reflector, one side face of which is the reflecting surface and the other side face of which is etched, to form an angle of 63° with the bottom face.

The bottom face of the reflector is preferably a bottom face having an angle 9.7° toward a <110> direction of the single crystal from the {100} plane. When the reflector is formed by etching, using the Si single crystal substrate which has a surface 9.7° toward a <110> direction from the (100) plane, the {111} plane is preferentially formed by etching and has an angle of 45° from the bottom face, and, therefore, the reflector can be formed easily and accurately.

It is preferable that the reflector have a top face parallel to the bottom face and that the edge where the reflecting surface and the top face or the bottom face join be within 5° of a <110> direction that is perpendicular to the direction 9.7° toward the <110> direction.

While the reflector is formed by etching with a mask aligned along the <110> direction perpendicular to the off-angle surface of the substrate, generation of a step which would otherwise be formed on the reflecting surface during etching is suppressed. Thus, a flat reflecting surface is formed by forming the side line of the mask within a deviation angle of 5° from a <110> direction perpendicular to the direction 9.7° toward the <110> direction and forming the edge, where the reflecting surface formed by etching and the top face or the bottom face join, within 5° of a <110> direction that is perpendicular to the direction 9.7° toward the <110> direction.

The present invention also provides an optical semiconductor device comprising an Si substrate having a semiconductor light emitting element on the surface of the substrate, the bottom face of the reflector is fixed on the Si substrate and the semiconductor light emitting element emits light toward the reflecting surface of the reflector. The light emitted by the semiconductor light emitting element in a direction parallel to the Si substrate surface is reflected by the reflecting surface in a direction perpendicular to the surface of the Si substrate.

Because the light emitting element and the reflector are fixed on the Si substrate, it is possible to manufacture an optical semiconductor device wherein light is emitted in a direction perpendicular to the Si substrate surface, without etching the Si substrate.

While forming the reflecting surface inclined by 45° in the conventional configuration requires use of a Si substrate having a surface oriented 9.7° toward the <110> direction from a (100) plane because the reflecting surface is formed on the Si substrate by etching, the reflector is formed separately according to the present invention, thereby making it possible to use a low cost (100) Si substrate, reducing cost.

The present invention also provides a method for producing a reflector which comprises preparing a Si substrate having a surface oriented 9.7° toward the <110> direction from a (100) plane, forming an etching mask along a direction perpendicular to the direction 9.7° toward the <110> direction, and etching the substrate by using the etching mask so that a {111} plane is exposed, wherein at least one of the {111} planes formed in the etching step is used as a reflecting surface and forms an angle of 45° with the Si substrate surface.

In the production method described, the mask forming may be a belt-shaped etching mask extending along a direction perpendicular to the direction 9.7° toward the <110> direction at specified intervals, and etching the Si substrate to penetrate the Si substrate. When such a method is used, it is possible to form a reflector having the reflecting surface inclined by 45° from the bottom face and implement mass production of the reflector easily, employing only etching.

In the production method described, the mask may also be formed as a belt-shaped etching mask along the direction perpendicular to the direction 9.7° toward the <110> direction at specified intervals, and etching the Si substrate halfway so that a step face for mounting the semiconductor light emitting element remains in the etched bottom face, and cutting off the face at right angles. When such a method is employed, it is possible to easily manufacture the reflector having a stepped face on which the light emitting element is mounted.

In the production method described, the mask formed may be a lattice-shaped etching mask along the direction perpendicular to the direction 9.7° toward the <110> direction, forming a recessed portion with a rectangular top face and turning the side faces of the recess into reflecting surfaces by etching, and cutting off the Si substrate which has the etched recess, wherein the reflecting surface and the two etched side faces adjacent to opposite sides of the reflecting surface are formed. When such a method is employed, it is possible to form the stepped portion, which would otherwise be formed on the reflecting surface, on the etched side face adjacent to the reflecting surface, to form the reflector having a reflecting surface of excellent flatness, without a step.

The mask forming preferably includes forming the side line of the mask within a deviation angle of 5° from a <110> direction which is perpendicular to the direction 9.7° toward a <110> direction. When such a mask forming step is employed, generation of a step in the reflecting surface during etching is suppressed, making it possible to form the flat reflecting surface.

The present invention also provides a method for producing an optical semiconductor device comprising forming a light detecting portion by making a region of a second conductivity type in a Si substrate of a first conductivity type while making an aperture in an $SiO_2$ film on the light detecting portion and embedding an electrode therein, fixing a semiconductor light emitting element, which emits light in a direction parallel to the surface of an Si substrate, on the Si substrate, and fixing the bottom face of the reflector, having a reflecting surface to reflect light in a direction perpendicular to the Si substrate surface, on the surface of the Si substrate.

The present invention also provides a method for producing an optical semiconductor device, comprising forming a light detecting portion by making a region of the second conductivity type in the Si substrate of the first conductivity type while making an aperture in an $SiO_2$ film on the light detecting portion and forming an electrode, wherein a semiconductor light emitting element is mounted on a step of the reflector and the reflector is fixed on the Si substrate surface, so that light emitted by the semiconductor light emitting element in a direction parallel to the step face is reflected on the reflecting surface of the reflector in a direction perpendicular to the Si substrate surface.

An optical semiconductor device according to the present invention has a reflector which has been made separately fixed on the Si substrate, not by forming the reflecting surface in a groove formed by etching the Si substrate as in the prior art. In producing the optical semiconductor device, therefore, it is not necessary to protect the light emitting element during etching of the Si substrate, thereby making it possible to reduce the number of production steps and provide an optical semiconductor device very suitable for mass production.

Because the reflector is made separately from the Si substrate, the reflecting surface can be prevented from roughening due to heat treatment of the Si substrate.

In the optical semiconductor device according to the present invention, because the reflector can be fixed on the Si substrate and the light emitting element fixed on the step of the reflector in advance, accuracy of aligning the reflector and the light emitting element can be improved and mass-production can be improved.

In the optical semiconductor device according to the present invention, because the reflecting surface is adjacent to the etched side face, occurrence of a step in the reflecting surface during etching of the reflecting surface can be suppressed, making it possible to produce an optical semiconductor device having a reflector of excellent flatness.

In the optical semiconductor device according to the present invention, a flat reflecting mirror surface having a roughness of about 1% of the wavelength of the laser beam is used as the reflecting surface of the reflector, whereby the laser beam reflected from the reflecting surface has a uniform distribution of the light intensity, and the error in reading a signal beam can be reduced.

Also, as the {111} plane is made by etching the Si single crystal substrate, the angle between the reflecting surface and the bottom face of the Si single crystal substrate can be easily controlled to be exactly 45°, and mass-production of the optical semiconductor device can be improved.

The present invention also provides a reflector which has a reflecting surface made of a polished flat surface of a Si single crystal substrate, and a {111} bottom face having an angle 45° from the reflecting surface.

The polished surface Si single crystal substrate has a very flat surface, and the roughness of the surface is about 1% of the wavelength of a laser beam, so a uniform distribution of the light intensity of the reflected laser beam can be obtained. The occurrence of errors in processing signals is reduced.

The reflector is formed by etching the Si single crystal substrate to expose the {111} plane. Therefore, it is possible to form easily a reflector having the etched bottom surface inclined at 45° from the reflecting mirror surface with high accuracy.

The reflector may also be a reflector one side surface of which is the bottom face and the other side face is an etched surface making an angle of 63° with the reflecting surface.

The reflecting surface of the reflector is preferably a surface of the Si single crystal substrate oriented 9.7° toward the <110> direction of the substrate from the {100} plane.

The reflecting face, namely, the surface of the Si single crystal, is a plane oriented 9.7° toward a <110> direction of the substrate with from the {100} plane, so it is possible to form easily the reflector having the etched bottom surface inclined at 45° from the reflecting mirror surface, and with high accuracy.

The present invention also provides an optical semiconductor device comprising an Si substrate having a semiconductor light detecting element on the surface thereof, a reflector having a bottom face fixed on the Si substrate, and a semiconductor light emitting element which emits light toward the reflecting surface of the reflector, wherein light emitted by the semiconductor light emitting element in a direction parallel to the Si substrate surface is reflected by the reflecting surface in a direction perpendicular to the surface of the Si substrate.

Because the optical semiconductor device is formed by fixing the reflector which reflects the laser beam emitted from the light emitting device on the Si substrate, a uniform distribution of the light intensity of the reflected laser beam can be obtained. The occurrence of errors in processing signals is reduced.

The present invention also provides a method for producing a reflector used for an optical semiconductor device which comprises:

preparing a Si substrate having a polished flat surface oriented 9.7° toward the <110> direction of the single crystal from a {100} plane;

forming a belt-shaped etching mask along a direction perpendicular to the direction 9.7° toward the <110> direction;

etching the substrate using the etching mask so that a {111} plane is exposed, wherein the surface is used as a reflecting surface, and the etched {111} plane inclined at 45° from the reflecting surface is used as the bottom face.

Because the reflecting face, namely, the surface of the Si single crystal, is a plane oriented 9.7° toward a <110> direction of the substrate from the {100} plane, it is possible to form easily the reflector having the etched bottom face inclined at 45° from the reflecting mirror surface, and with high accuracy.

In forming a mask according to the production method of the present invention, the side line of the mask is formed within a deviation angle of 5° from a <110> direction perpendicular to the direction 9.7° toward the <110> direction.

While the reflector is formed by etching with a mask lying along the <110> direction which is perpendicular to the direction 9.7° toward the <110> direction, generation of a step which would otherwise be formed on the bottom face during the etching step is suppressed, thereby forming a flat bottom face, by forming the side line of the mask within a deviation angle of 5° from a <110> direction perpendicular to the direction 9.7° toward the <110> direction and forming an edge, where the bottom face formed by etching and the top surface or the bottom surface of the substrate join, within a deviation angle of 5° from <110> direction perpendicular to the direction 9.7° toward the <110> direction.

Therefore, it is possible to form easily the reflector having the etched bottom surface inclined at 45° from the reflecting mirror surface, and with high accuracy.

BRIEF DESCRIPTION OF THE DRAWINGS

FIGS. 6A–6D are drawings of steps of producing a reflector according to the third embodiment of the present invention. FIG. 6B is a sectional view taken along line VIB—VIB of FIG. 6A, and FIG. 6C is a sectional view taken along line VIC—VIC of FIG. 6D.

DESCRIPTION OF THE PREFERRED EMBODIMENTS

Embodiment 1

Figure 1A:
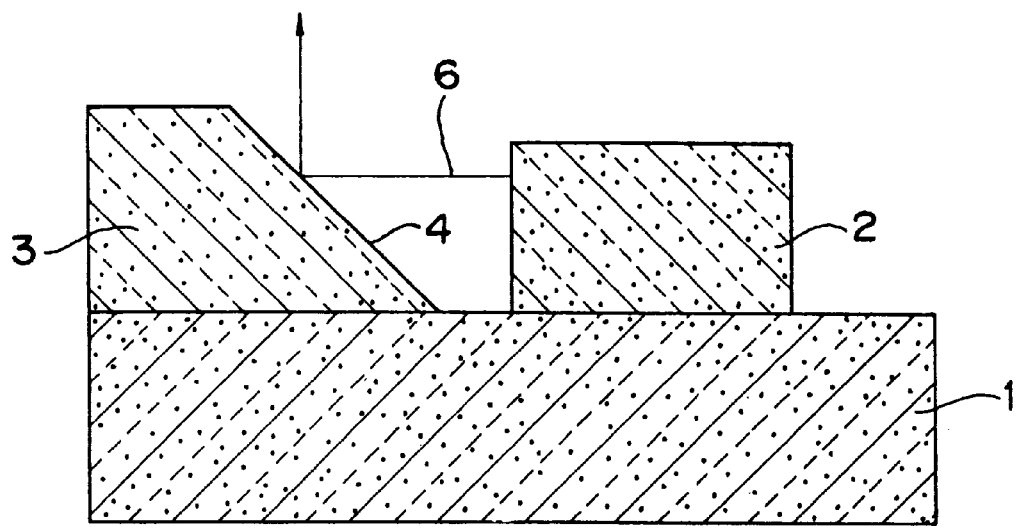
FIG. 1A is a cross-sectional view of an optical semiconductor device according to a first embodiment of the present invention taken along line IA—IA of FIG. 1B.
Figure 1B:
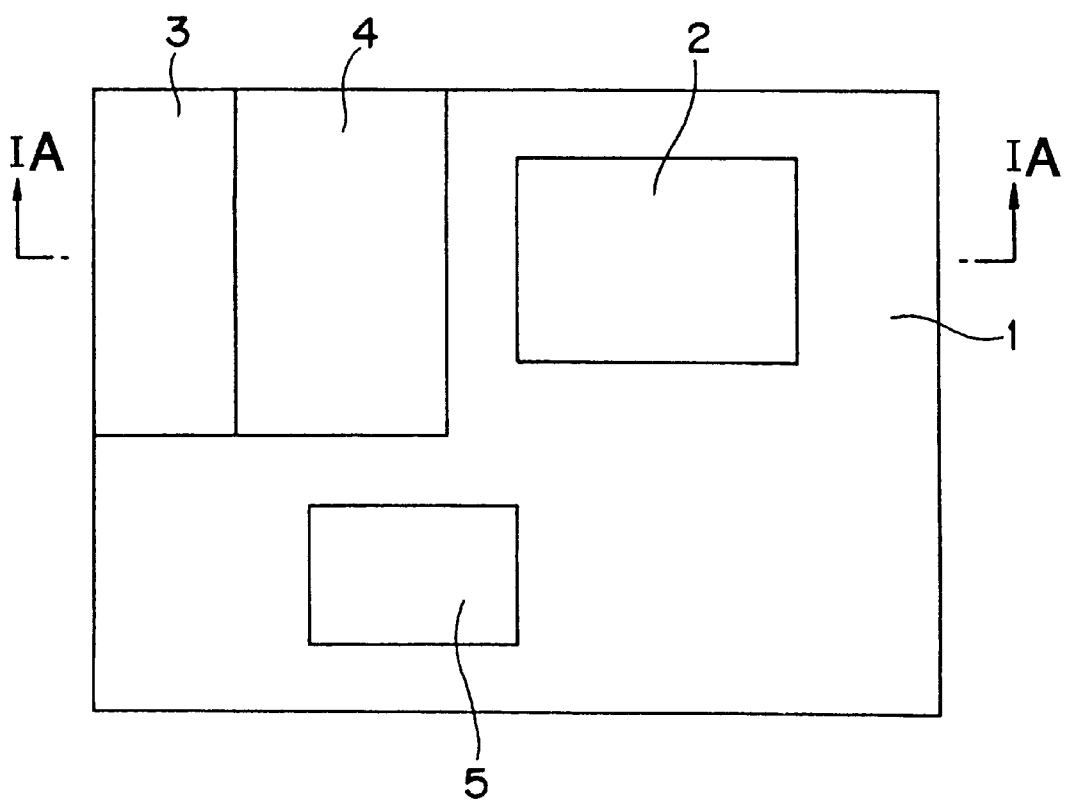
FIG. 1B is a top view of the optical semiconductor device according to the first embodiment of the present invention.
Figure 12A:
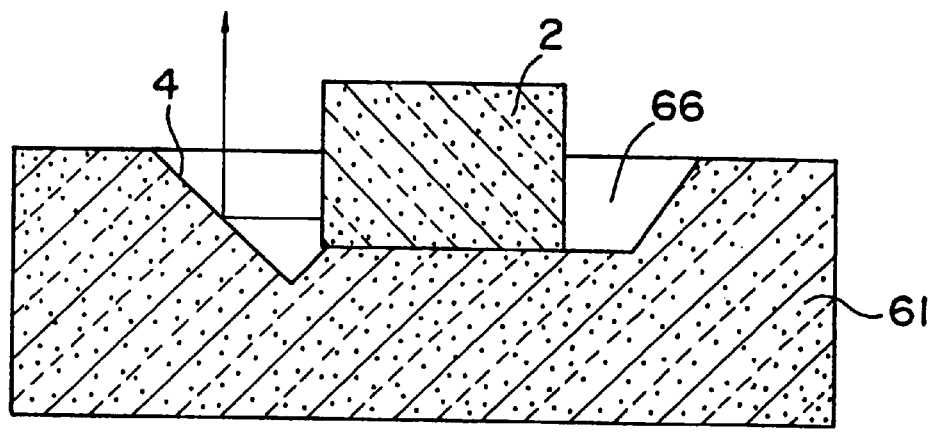
FIG. 12A is a cross-sectional view of the optical semiconductor device of the prior art taken along line XIIA—XIIA of FIG. 12B.
Figure 12B:
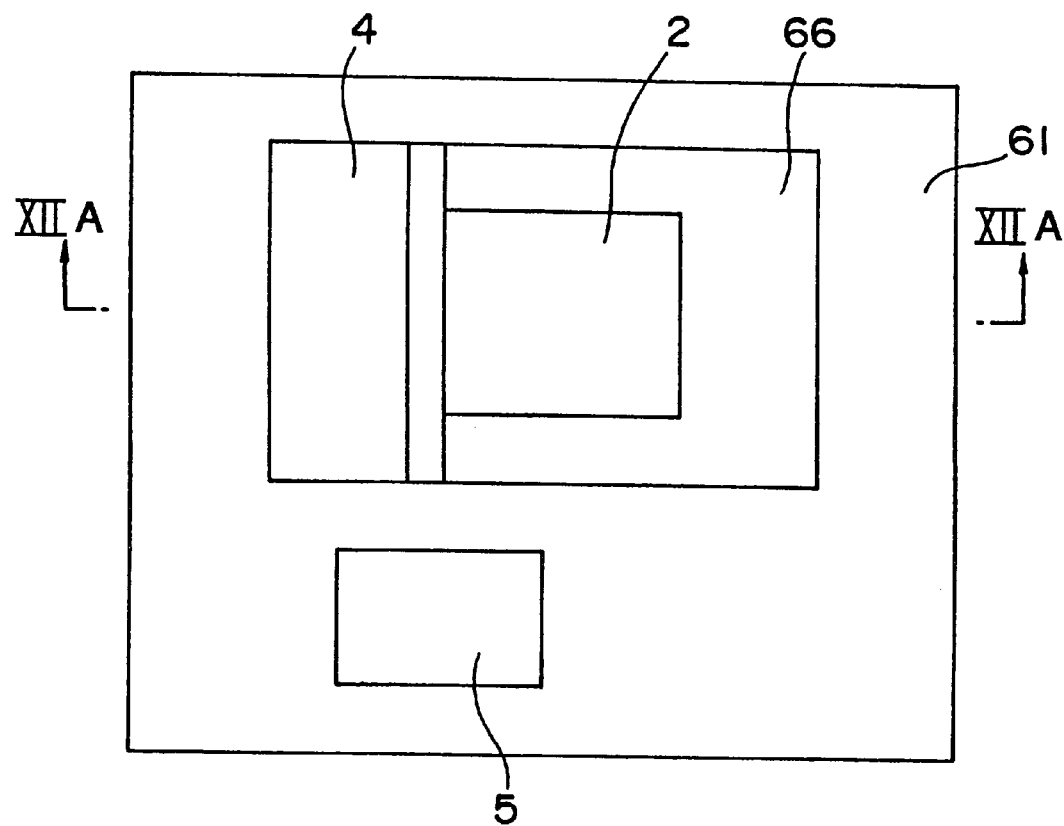
FIG. 12B is a top view of the optical semiconductor device of the prior art.
Figure 13:
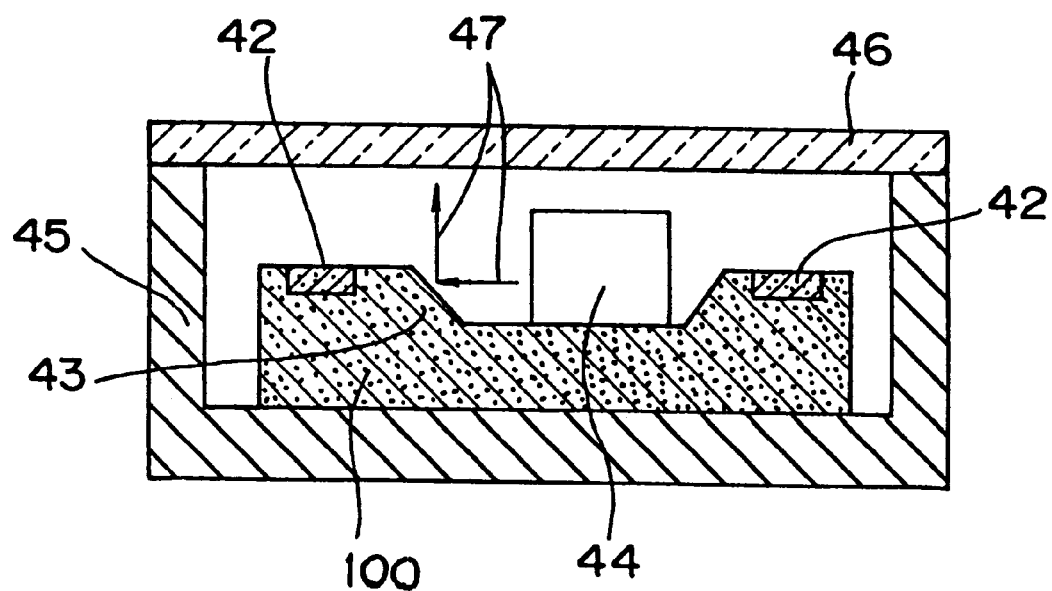
FIG. 13 is a cross-sectional view of another optical semiconductor device of the prior art.

FIG. 1 shows an optical semiconductor device according to one embodiment of the present invention. FIG. 1A is a cross sectional view along IA—IA of FIG. 1B, and FIG. 1B is a top view. In the drawing, numerals identical with those of FIG. 12B indicate the same or corresponding portions. In such an optical semiconductor device, a light emitting element 2 and a reflector 3 made of a single crystal of Si are fixed on a Si substrate 1, wherein a light detecting element 5 is located. Light 6 emitted by the light emitting element 2 in a direction parallel to the Si substrate surface is reflected by the reflecting surface 4 of the reflector 3 in a direction perpendicular to the Si substrate surface and is incident on an optical disk or the like (not shown). Light reflected on the optical disk enters the light detecting element 5 to be processed as an optical signal. The reflecting surface is preferably coated with a metal having a high reflectivity, such as Ti and Au.

FIGS. 2A–2E show steps of producing the reflector 3 according to the first embodiment.

Figure 2A:
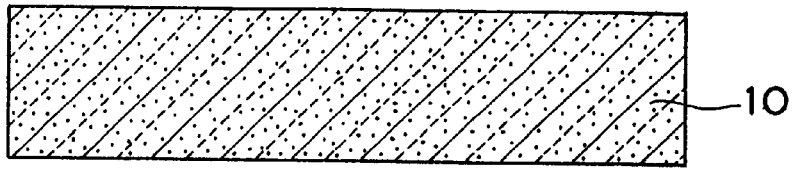
FIGS. 2A–2E are cross-sectional views of steps of producing a reflector according to the first embodiment of the present invention.

In the step of producing the reflector according to the first embodiment, first an Si single crystal substrate 10 is prepared as shown in FIG. 2A. For the Si single crystal substrate 10, a substrate having a surface oriented 9.7° toward the <110> direction, from a (100) plane, is used.

Figure 2B:
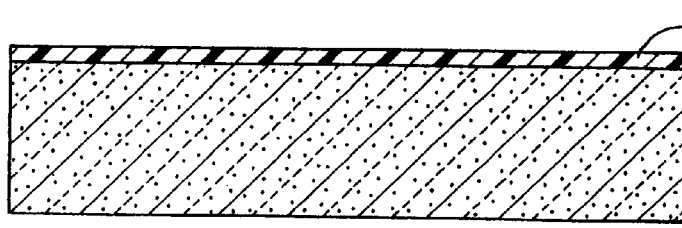

Then an $SiO_2$ film 7 is formed on the substrate surface by thermal oxidation, as shown in FIG. 2B.

Figure 2C:
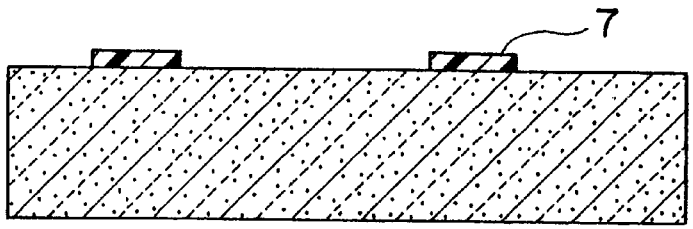

Then the $SiO_2$ film 7 on the substrate surface is etched in the photolithography step as shown in FIG. 2C to form a mask for etching the Si single crystal substrate 10.

While the mask is formed on the Si single crystal substrate 10 along the <110> direction, which is perpendicular to the direction of the substrate surface, it is preferable that the mask be formed within a deviation of 5° from the <110> direction which is perpendicular to the direction of the surface of the substrate. This is because, when the mask is formed with a deviation angle of 5° or less, it is possible to suppress the formation of steps in the etched surface during etching of the Si single crystal substrate 10 and to form an etched reflecting surface 4 having excellent flatness.

Then, after coating the back face of the Si single crystal substrate 10 with wax 11 or the like, as shown in FIG. 2B, the Si single crystal substrate 10 is etched until the Si single crystal substrate 10 is penetrated, using KOH at a temperature about 100° C. as the etchant. In the etching step, the {111} plane, which is etched at a lower rate, is preferentially formed as the etched surface. Therefore, a reflecting surface having an angle exactly 45° from the bottom face of the substrate is formed using the substrate having a surface 9.7° toward the <110> direction from a (100) plane as the Si single crystal substrate 10, as described above.

Figure 2D:
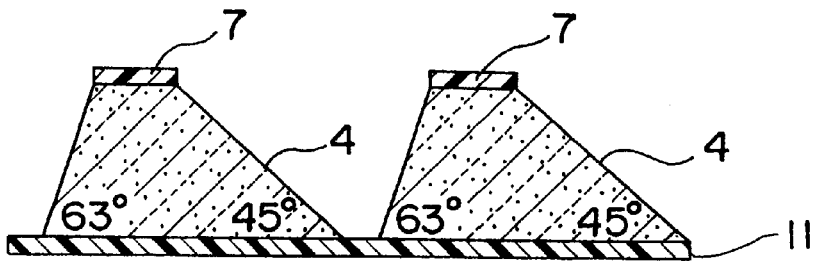

Another side face to be formed by etching is formed at an angle of 63° from the bottom face of the substrate. Although the side face opposing the reflecting surface of the reflector 3 is cut in a direction perpendicular to the bottom face in FIG. 1, the {111} plane etched as shown in FIG. 2D may also be used.

Figure 2E:
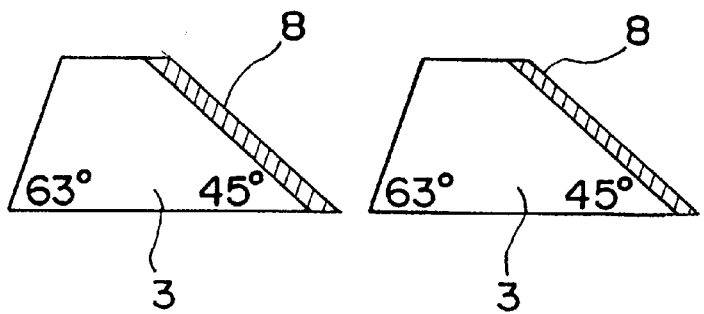

Finally, Au and Ti 8 are laminated successively by evaporation, after removing the $SiO_2$ film 7, to complete the reflector 3 as shown in FIG. 2E. The reflector may be cut in a direction parallel to the cross section.

By forming the reflector by etching the Si single crystal substrate having a surface with a specified orientation as described above, it is possible to form the reflector 3 having the reflecting surface inclined at 45° from the bottom face with high accuracy only by etching. That is, necessity for high accuracy of etching angle is eliminated, unlike forming the reflecting surface by mechanical cutting, solely by selecting the orientation of the surface of the substrate, thereby simplifying production and providing a process suited to mass production.

FIGS. 3A–3E are cross sectional views of steps of producing the optical semiconductor device according to the first embodiment of the present invention.

Figure 3A:
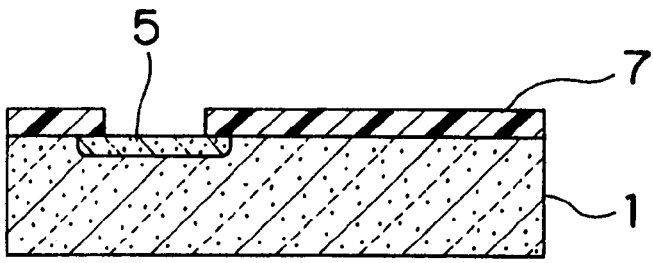
FIGS. 3A–3E are cross-sectional views of production steps of a optical semiconductor device according to the first embodiment of the present invention.

First, as shown in FIG. 3A, the $SiO_2$ film 7 is formed on the p-type Si substrate 1 by thermal oxidation, and an aperture is made at a specified position by means of photolithography. This is followed by thermal diffusion wherein phosphorus, for example, is diffused to form an n type region of the light detecting element 5.

Figure 3B:
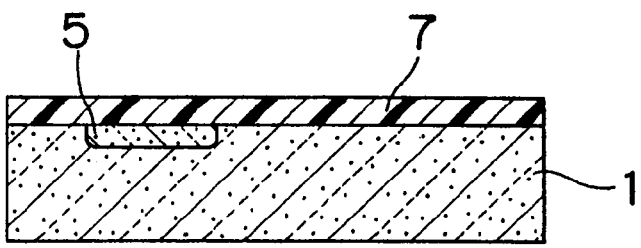

Then, as shown in FIG. 3B, thermal oxidation is employed again to cover the entire surface of the Si substrate with the $SiO_2$ film 7.

Figure 3C:
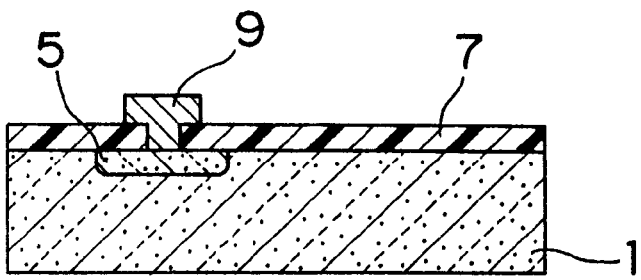

Then, as shown in FIG. 3C, photolithography is employed to make an aperture at a specified position of the $SiO_2$ film 7 and form an electrode 9 of the light receiving element 5.

Figure 3D:
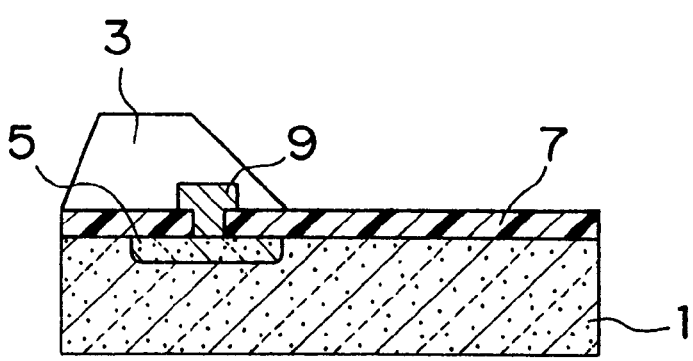

Then, as shown in FIG. 3D, the bottom face of the reflector 3 which is made in advance, in the production step shown in FIG. 2, is adhered by a thermosetting resin to the $SiO_2$ film 7 at the specified position of the Si substrate 1. As a result, the reflecting surface 4 of the reflector 3 is inclined at an angle of 45° from the surface of the Si substrate 1.

Figure 3E:
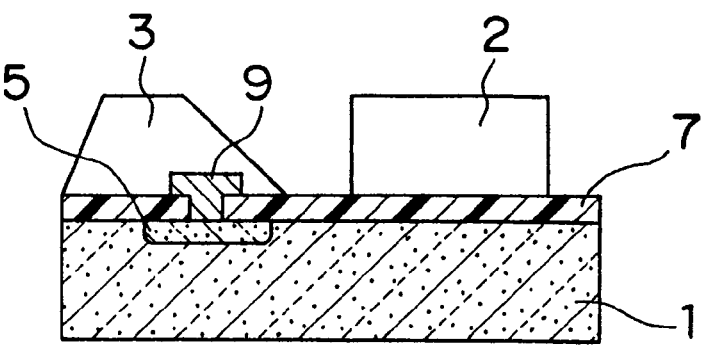

Then, as shown in FIG. 3E, the light emitting element 2 is fixed by means of a Au—Sn solder on the $SiO_2$ film 7 at the specified position of the Si substrate 1. In such a configuration, light 6 emitted by the light emitting element 2 enters the reflecting surface 4 of the reflector 3 in a direction parallel to the surface of the Si substrate 1, and is reflected on the reflecting surface 4 in a direction perpendicular to the surface of the Si substrate 1.

For the light emitting element 2, a light emitting element having relatively low heat dissipation, namely a light emitting element having power output up to 10 mW or showing a characteristic temperature, $T_0$, not less than 90°K, even when mounted directly on the Si substrate, can be used. The light emitting element 2 may be made of AlGaInAs which emits light having a wavelength in a range from 630 to 690 nm or AlGaAs which emits light having a wavelength in a range from 750 to 830 nm.

Although the steps described above are organized in the order of first fixing the reflector 3 on the Si substrate 1 and then fixing the light emitting element 2, the order of the steps may be reversed.

The completed optical semiconductor device may be mounted in a package as required.

In the optical semiconductor device according to the first embodiment, as described above, because the reflector 3 which has been made separately is mounted on the Si substrate 1 instead of forming the reflecting surface 4 in a groove formed by etching the Si substrate 1, as in the prior art, protection of the light detecting element 5 during etching of the Si substrate 1, which has been required in the prior art, becomes unnecessary.

Because the surface of the Si substrate 1 is flat, the surface of the photoresist film formed on the Si substrate 1 during the photolithography step is flat, it is possible to make a pattern of high accuracy.

Because the reflector 3 is made separately from the Si substrate 1, it is possible to prevent the reflecting surface 4 from becoming rough due to the segregation of crystalline defects occurring in the heat treatment step carried out at 1000° C. for the formation of the light detecting element 5.

Embodiment 2

Figure 4A:
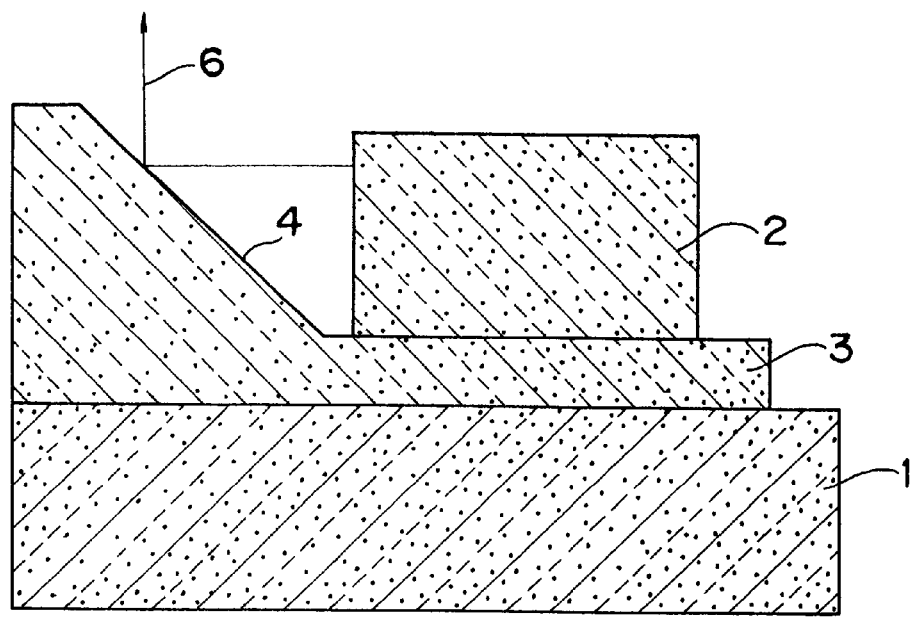
FIG. 4A is a cross-sectional view of an optical semiconductor device according to a second embodiment of the present invention taken along line IVA—IVA of FIG. 4B.
Figure 4B:
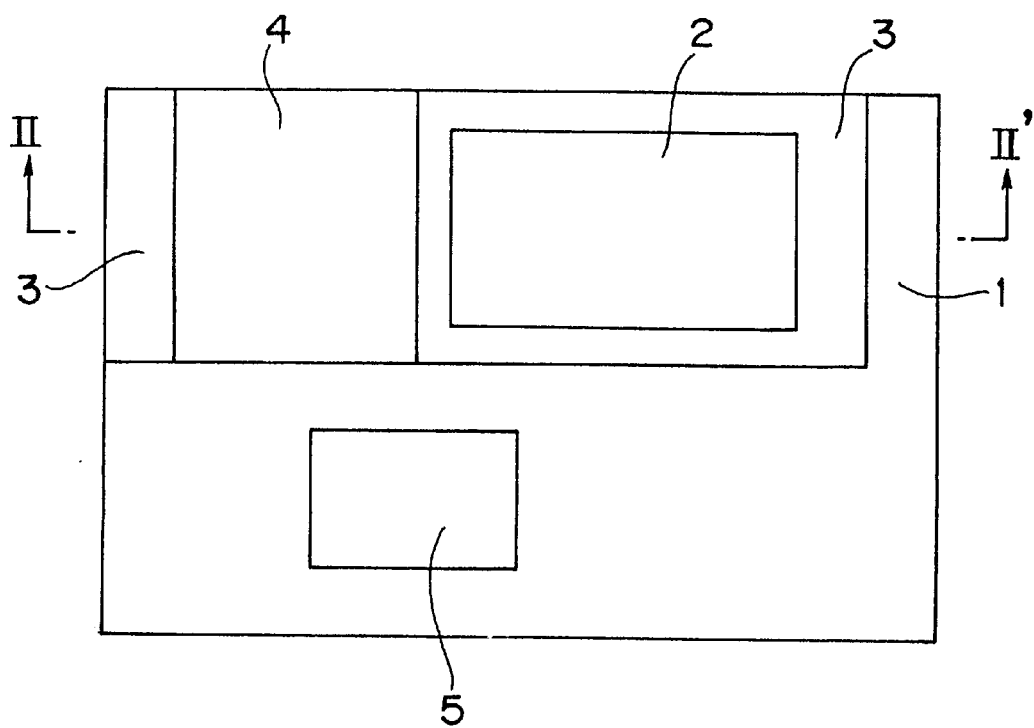
FIG. 4B is a top view of the optical semiconductor device according to the second embodiment of the present invention.

FIGS. 4A and 4B show an optical semiconductor device according to another embodiment of the present invention. FIG. 4A is a sectional view taken along direction IVA—IVA of FIG. 4B and FIG. 4B is a top view. In these figures, numerals identical to those of FIG. 12B indicate the same or corresponding portions.

In the optical semiconductor device according to the second embodiment of the present invention, the reflector 3 has a step on which the light emitting element 2 is located. The surface of the step is parallel to the bottom face of the reflector 3.

The reflector 3 according to the second embodiment can be made by carrying out the production steps of the first embodiment (FIGS. 2A–2C), then stopping the etching step of FIG. 2D so that the etched bottom face remains, and cutting off the etched bottom face in a direction perpendicular to the Si substrate 10. The length of the step can be adjusted by controlling the spacing of the $SiO_2$ masks 7 formed in the step of FIG. 2C.

The optical semiconductor device according to the second embodiment can be made by the production steps of the optical semiconductor device according to the first embodiment (FIGS. 3A–3C). The light emitting element 5 has been fixed on the step with Au—Sn solder or the like, and then the reflector 3 is adhered to the Si substrate 1 at the specified position on the SiO$_2$ film 7 with a thermosetting resin.

Thus, because the reflecting surface 4 of the reflector 3 and the light emitting element 5 can be aligned in advance, alignment can be done easily and production can be simplified.

Embodiment 3

Figure 5A:
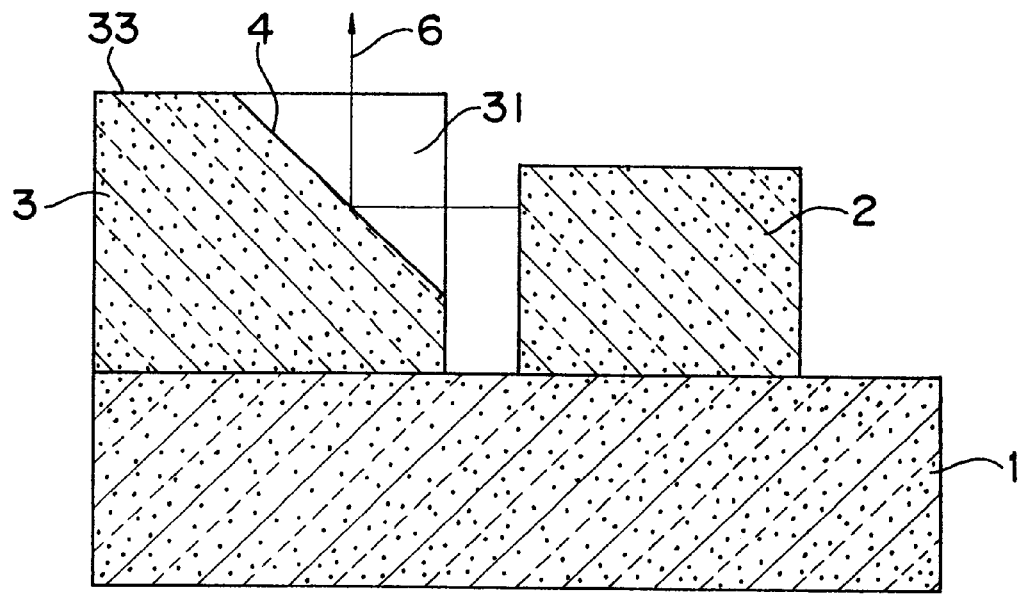
FIG. 5A is a cross-sectional view of an optical semiconductor device according to a third embodiment of the present invention taken along line VA—VA of FIG. 5B.
Figure 5B:
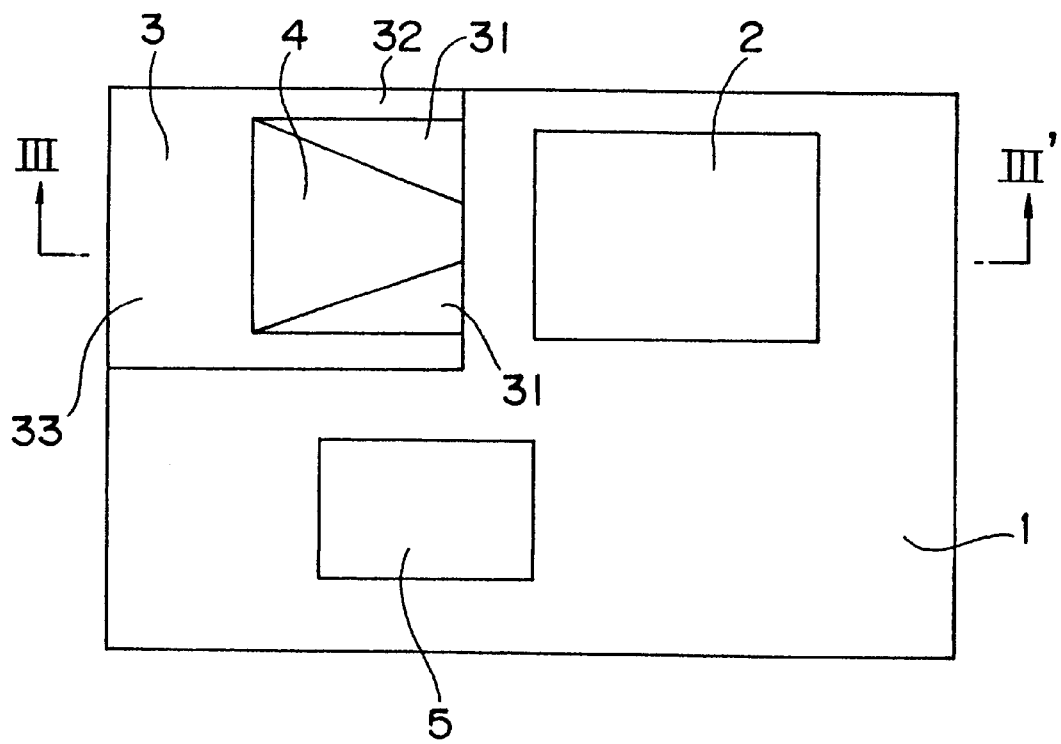
FIG. 5B is a top view of an optical semiconductor device according to the third embodiment of the present invention.

FIGS. 5A and 5B show an optical semiconductor device according to another embodiment of the present invention. FIG. 5A is a sectional view along direction VA—VA of FIG. 5B and FIG. 5B is a top view. In these figures, numerals identical to those of FIG. 12B indicate the same or corresponding portions.

In the optical semiconductor device according to the third embodiment, the reflector 3 has a planar C-shaped top face 32 parallel to the bottom face, a reflecting surface 4, formed by etching, joining the inner edge of the top face, and two etched side faces 31 adjacent to opposite sides of the reflecting surface.

The reflector 3 according to the third embodiment is made by production steps according to the first embodiment (FIGS. 3A and 3B), then forming the SiO$_2$ film 7 mask in a lattice configuration. One side of the lattice is aligned along the <110> direction that is perpendicular to the direction 9.7° toward the <110> direction, as shown in FIG. 6A. The Si single crystal substrate 10 is etched to have a recessed configuration, leaving the etched bottom face, using the SiO$_2$ film 7 as the mask. FIG. 6B is a cross-sectional view taken along the direction VIB—VIB of FIG. 6A.

Then the Si single crystal substrate 10 is cut at right angles to the bottom face of the substrate along the lines A and A' of FIG. 6B, to form the reflector 3. FIG. 6C is a cross sectional view along the direction VIC—VIC of FIG. 6D and FIG. 6D is a top view of the reflector 3.

The mask is preferably aligned within an angle of 5° from the <110> direction that is perpendicular to the direction 9.7° toward the <110> direction for forming an etched reflecting surface 4 having excellent flatness, as in the first embodiment.

Because the reflector 3 has two etched side faces 31 adjacent to opposite sides of the reflecting surface 4, the reflecting surface 4 has excellent flatness without a step which would otherwise be formed on the reflecting surface 4 on two etched side faces adjacent to opposite sides of the reflecting surface in etching the reflecting surface 4.

The optical semiconductor device according to the third embodiment can be produced according to the first embodiment shown in FIGS. 3A–3E by replacing the reflector 3 with the reflector of this embodiment.

Embodiment 4

Figure 7A:
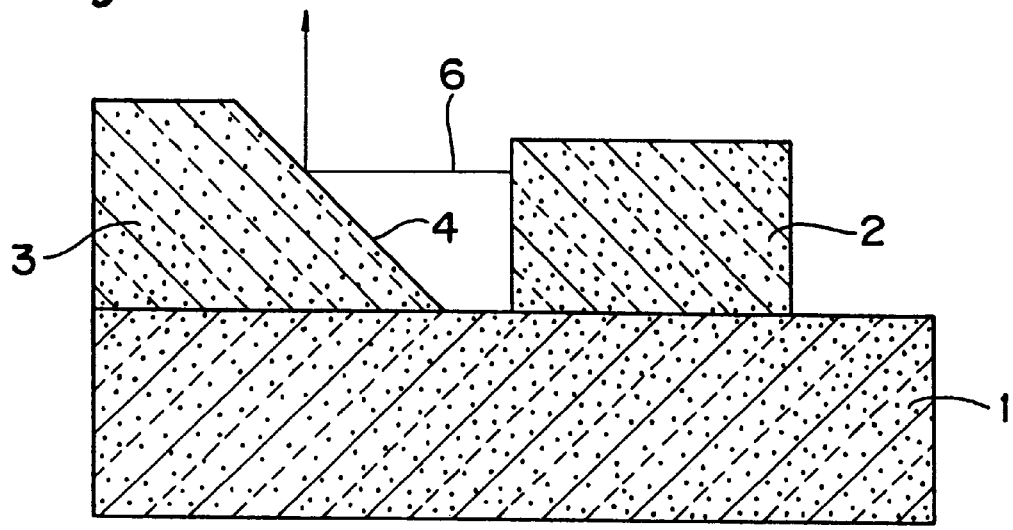
FIG. 7A is a cross-sectional view of an optical semiconductor device according to a fourth embodiment of the present invention taken along line VIIA—VIIA of FIG. 7B.
Figure 7B:
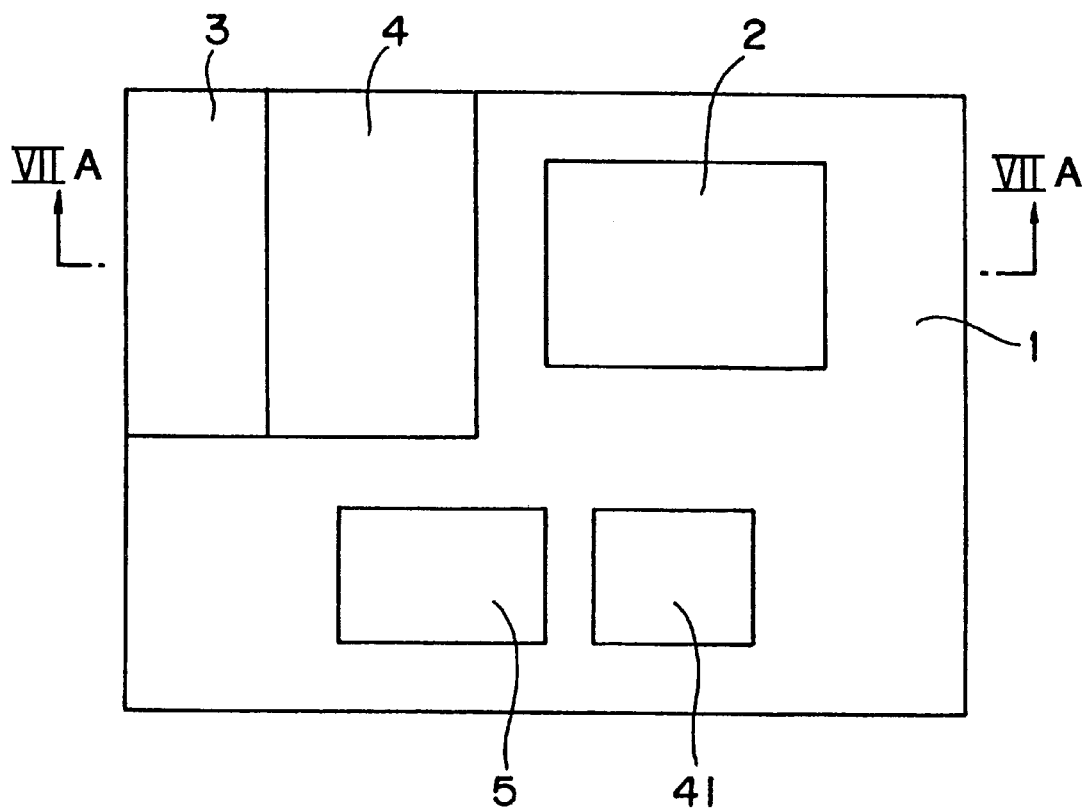
FIG. 7B is a top view of an optical semiconductor device according to a fourth embodiment of the present invention.

FIGS. 7A and 7B show an optical semiconductor device according to another embodiment of the present invention. FIG. 7A is a sectional view taken along direction VIIA—VIIA of FIG. 7B and FIG. 7B is a top view. In these figures, numerals identical to those of FIG. 12B indicate the same or corresponding portions. Numeral 41 denotes an integrated circuit (IC) 41 on the surface of the Si Substrate 1.

Because the optical semiconductor device of the present invention does not have a reflecting surface formed by etching the Si substrate 1, as in the prior art, it is possible to form the IC 41 including an amplifier circuit, a signal processing circuit, and other circuits, in addition to the light detecting element 5, on the Si substrate 1.

As a result, semiconductor elements can be integrated with higher density and made smaller.

The present invention can be applied to any light emitting element other than those having a low power output, up to 10 mW, and characteristic temperature, $T_0$, of 90°K or higher, provided that the light emitting element has low heat dissipation and provides desired light emitting characteristics.

Embodiment 5

Figure 8A:
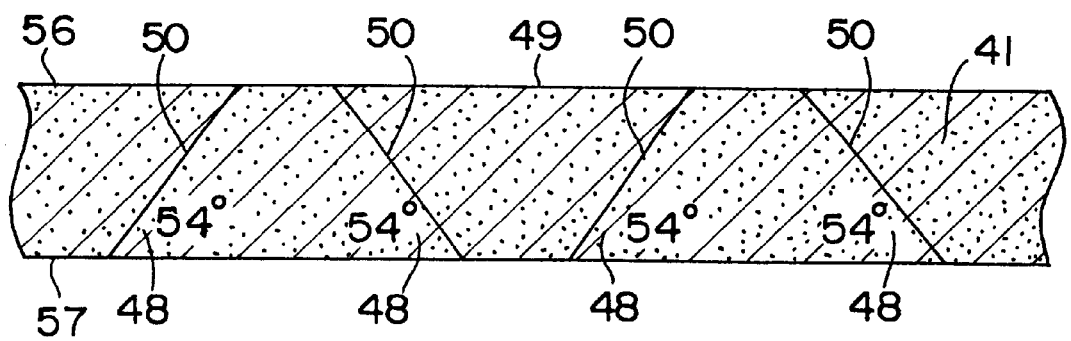
FIG. 8A is a Si single crystal substrate according to a fifth embodiment of the present invention.
Figure 8B:
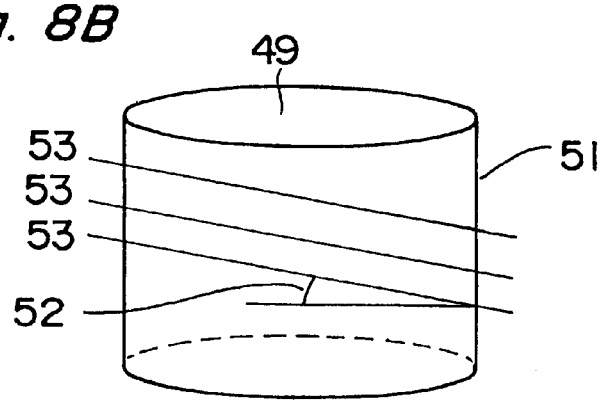
FIG. 8B is a slice direction of a Si single crystal substrate according to the fifth embodiment of the present invention.

FIGS. 8A and 8B show a Si single crystal substrate according to a fifth embodiment of the present invention.

FIG. 8A is a cross sectional view of an Si single crystal substrate 41 having a (100) substrate surface 49. The Si single crystal substrate 41 has etched surfaces 50 inclined at 54° from the top surface 56 and the bottom surface 57, made by wet etching using KOH. This is because of the difference of the etching rates of the (100) plane 49 and (111) plane 50. For instance, the ratio of etching rates of the (100) plane 49 to the (111) plane 10 is 400 to 1, using a 30 wt % KOH solution as the etchant at a temperature of 85° C.

As shown in FIG. 8A, in case of using a Si single crystal substrate having the (100) plane surface 49, the substrate is etched very much toward the <100> direction. On the other hand, the (111) plane 50 is hardly etched, and the (111) plane 50 is fabricated as an etched surface. The (111) plane 50 has an angle of 54° from the (100) substrate surface.

This means that the angle between the etched (111) plane and the surface of Si single crystal substrate 41 can be controlled at will by fabricating the Si single crystal surface having a predetermined angle from the (100) plane.

As shown in FIG. 8B, a Si single crystal substrate 41 which is prepared by slicing a Si ingot along the slice-line 53 having an angle of 9.7° from (100) plane 49 is used as the substrate for fabricating the reflector. Therefore, the angle between the surface of the Si single crystal substrate 41 and the etched (111) plane can be controlled to be exactly 45°.

FIGS. 9A–9E show steps of producing the reflector 58 according to another embodiment of the present invention.

Figure 9A:
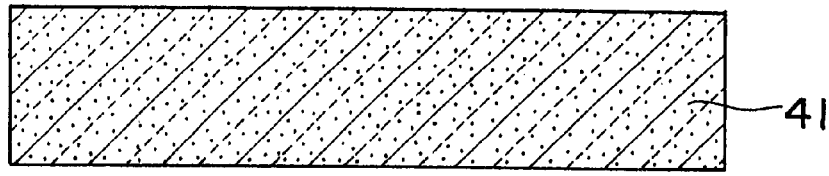
FIGS. 9A–9E are drawings of steps of producing a reflector according to the fifth embodiment of the present invention.

In the step of producing the reflector according to the fifth embodiment, an Si single crystal substrate 41 is prepared as shown in FIG. 9A. For the Si single crystal, a substrate 41 having a surface oriented 9.7° toward the <100> direction from a (100) plane is used.

Generally, the top surface and the bottom surface of the Si single crystal substrate are polished and prepared with smooth mirror faces. That is, the top surface and the bottom surface of the Si single crystal substrate are polished to have exactly smooth mirror faces with a roughness of 50 nm from the peak to the valley. The average of the roughness is about 10 nm. Because the roughnesses of these surfaces are about 1% of a wavelength of red laser light (about 650 nm), the surfaces can be used as the reflecting surface of the reflector.

Figure 9B:
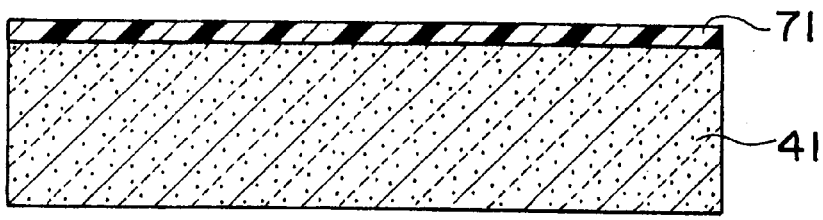

An SiO$_2$ film 71 is formed on the opposite surface of the reflecting surface of the substrate by thermal oxidation, as shown in FIG. 9B.

Figure 9C:
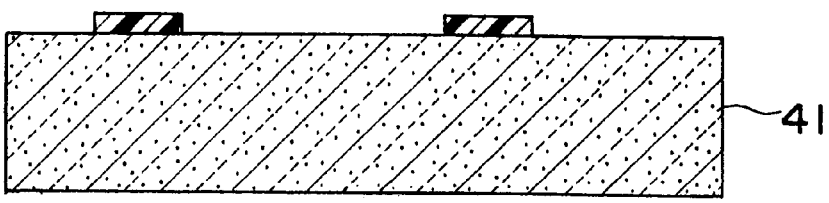

The SiO$_2$ film 71 on the substrate 41 surface is etched in a photolithography step, as shown in FIG. 9C, to form a mask for etching the Si single crystal substrate 41.

While the mask is formed on the Si single crystal substrate 41 along the <110> direction which is perpendicular to the direction 9.7° toward the <110> direction of the substrate, it is preferable that the mask be formed within a deviation angle of 5° from the <110> direction which is perpendicular to the direction 9.7° of the substrate 9.7° toward the <110> direction. When the mask has a deviation angle of 5° or less, the formation of a step in the etched surface during the etching of the Si single crystal substrate 41 is suppressed and a (111) etched surface having excellent flatness is produced.

Figure 9D:
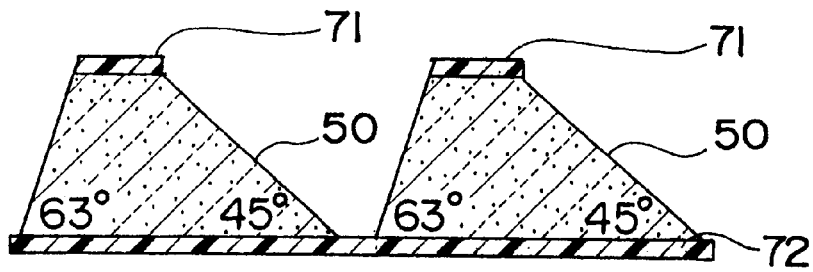

After coating the reflecting surface of the Si single crystal substrate 41 with wax 72, as shown in FIG. 9D, the Si single crystal substrate 41 is etched until the Si single crystal substrate 41 is penetrated, using KOH at a temperature about 85° C. as the etchant. In the etching step, the {111} plane, which is etched at a lower etching rate, is preferentially formed as the etched surface, as described above. Therefore, the (111) etched surface having an angle exactly 45° from the surface of the Si single crystal substrate 41 (reflecting surface) is formed by using the substrate having a surface oriented 9.7° toward the <110> direction from a (100) plane, as the Si single crystal substrate 41.

Another side face is formed at an angle of 63° from the bottom face of the substrate.

Figure 9E:
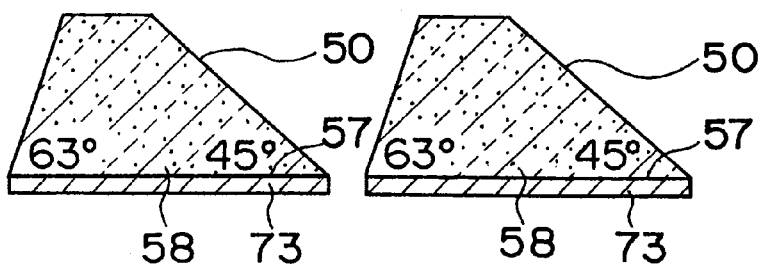

Au and Ti 73 are laminated successively by evaporative deposition, after removing the SiO$_2$ film 71, to complete the reflector 58 as shown in FIG. 9E. The reflector may be cut in a direction parallel to the cross section and used.

By forming the reflector 58 by etching the Si single crystal substrate 41 having a specified surface orientation as described above, it is possible to form the reflector 58 having the etched bottom surface inclined at 45° from the reflecting mirror surface with high accuracy solely by etching. That is, the necessity for high accuracy of etching angle is eliminated, unlike the case of forming the reflecting surface by mechanical cutting, solely by selecting the crystalline orientation of the surface of the substrate, thereby simplifying production and providing a process suited for mass production.

FIGS. 10A–10D show steps of producing the optical semiconductor device according to this embodiment of the present invention.

Figure 10A:
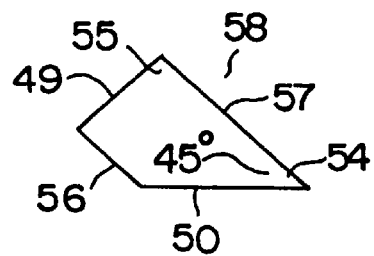
FIGS. 10A–10D are cross-sectional views of steps of producing an optical semiconductor device according to the fifth embodiment of the present invention.

As shown in FIG. 10A, the reflector 58 is prepared as shown in FIG. 9A. This reflector 58 has the etched bottom face in a (111) plane 50 and reflecting surface 57.

Figure 10B:
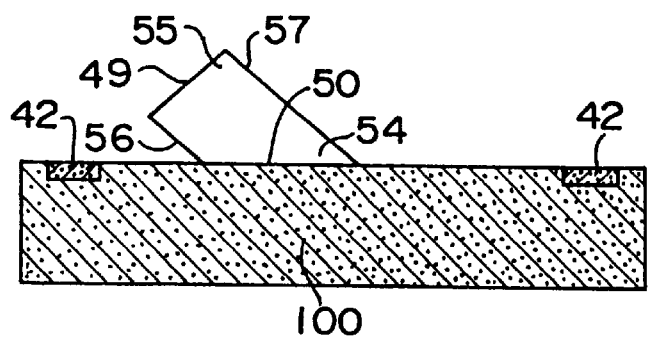

Then, as shown in FIG. 10B, an SiO$_2$ film (not shown) is formed on the p-type Si device substrate 100 by thermal oxidation, and an aperture is made at a specified position by photolithography. This is followed by a thermal diffusion process wherein phosphorus, for example, is diffused to form an n type region as the light detecting element 42. An electrode is formed on the light detecting element 42, if necessary.

After fabricating the light detecting element, the etched bottom face 50 of the reflector 58, which is made in advance, is mounted with a thermosetting resin at a specified position on the Si device substrate 100. As a result, the reflecting mirror surface 57 of the reflector 58 is inclined at an angle of 45° from the surface of the Si device substrate 100.

Figure 10C:
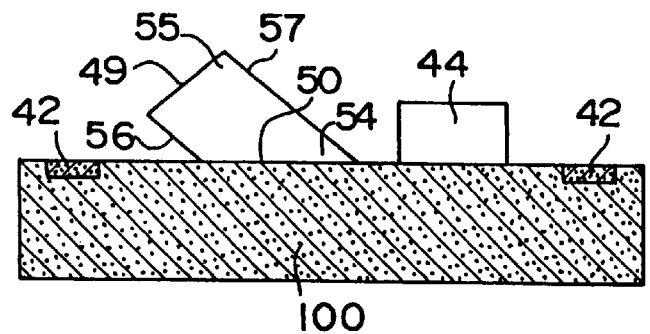

Finally, as shown in FIG. 10C, the light emitting element 44 is fixed by a Au—Sn solder at a specified position of the Si device substrate 100, and the optical semiconductor device is completed.

Figure 10D:
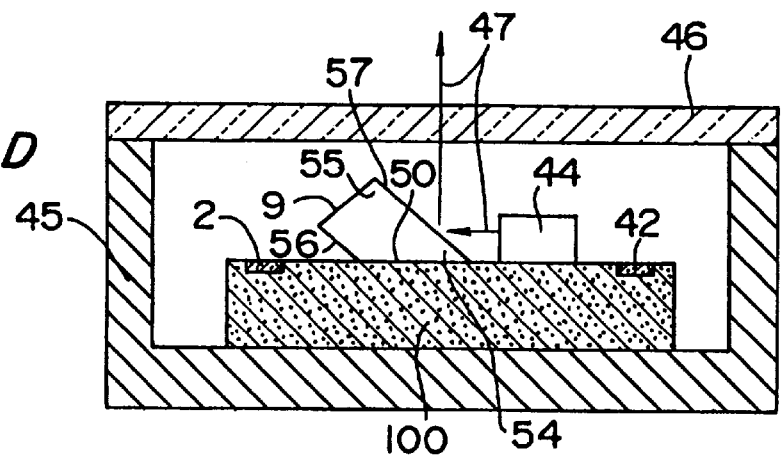

Generally, as shown in FIG. 10D, the Si device substrate 100 is mounted in a package 45 with a resin or a solder or the like. A hologram 46 is fixed by means of a resin or the like to the upper surface of the package 45.

Although the steps described above are organized in the order of first fixing the reflector 48 on the Si device substrate 100 and then fixing the light emitting element 44, the order of the steps may be reversed.

In the optical semiconductor device according to this embodiment, laser beam 47 emitted by the light emitting element 44 is incident on the reflecting mirror surface 57 of the reflector 58 in a direction parallel to the surface of the Si device substrate 100, and reflected from the reflecting surface 57 in a direction perpendicular to the surface of the Si device substrate 100. Therefore, the laser beam 47 reflected from the very flat mirror surface 57 has a uniform distribution of light intensity, and reading error of the signal beam in tracking and focusing can be reduced.

The optical semiconductor device according to the present embodiment has a configuration such that the reflector 58, which has been made separately, is fixed to the Si device substrate 100, not by forming the reflecting surface in a groove formed by etching the Si substrate as in the prior art. In the step of producing the optical semiconductor device, therefore, it is not necessary to protect the light detecting element 42 during etching of the Si device substrate 100, thereby making it possible to reduce the number of production steps and provide an optical semiconductor device very suitable for mass production.

This embodiment can be applied to any light emitting element 44 other than those having a low power output, up to 10 mW, and characteristic temperature, $T_0$, of 90°K or higher, provided that the light emitting element has low heat dissipation and provides desired light emitting characteristics.

Also the light emitting element 42 may be AlGaInAs which emits light having wavelengths in a range from 630 to 690 nm or AlGaAs which emits light having wavelengths in a range from 750 to 830 nm.

Embodiment 6

Figure 11A:
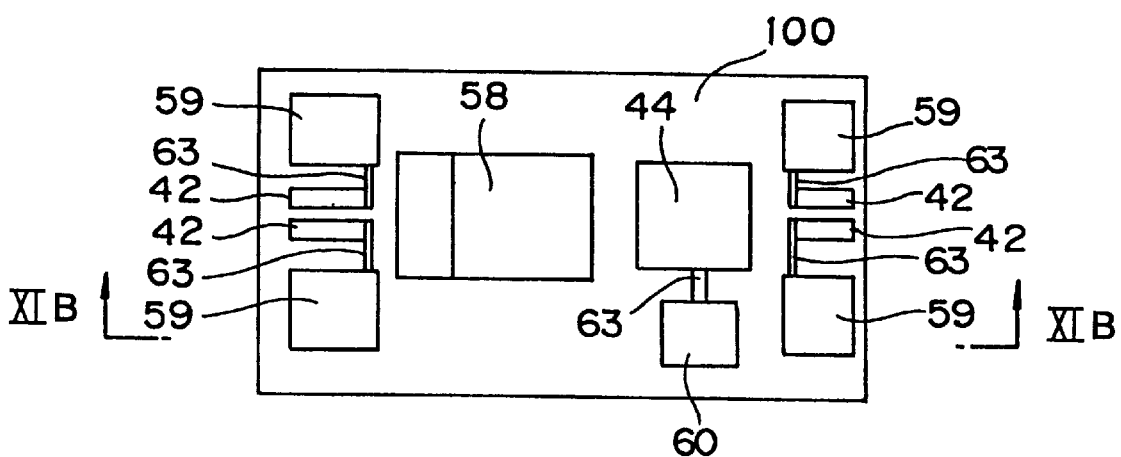
FIG. 11A is a top view of an optical semiconductor device according to a sixth embodiment of the present invention.
Figure 11B:
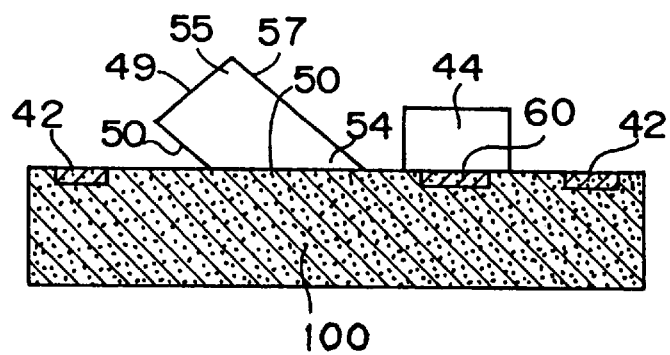
FIG. 11B is a cross-sectional view of the optical semiconductor device according to the sixth embodiment of the present invention taken along line XIB—XIB of FIG. 11A.

FIGS. 11A and 11B show an optical semiconductor device according to the sixth embodiment of the present invention.

FIG. 11A is top view of the optical semiconductor device, and FIG. 11B is a cross sectional view taken along line XIB—XIB of FIG. 11A. In the drawing, numerals identical with those of FIG. 10D indicate the same or corresponding portions. Numeral 59 denotes an amplifier IC, numeral 60 denotes a driver IC, and 63 denotes a wire connecting these ICs.

Because the optical semiconductor device of the present invention does not have the reflecting surface 47 formed by etching the Si device substrate 100, as in the prior art, it is possible to form an IC section which has an amplifier circuit, a signal processing circuit, and other circuits, in addition to the light detecting element 42, on the Si device substrate 100.

As a result, semiconductor elements can be integrated with a higher density and made smaller.

What is claimed is:

1. An optical semiconductor device comprising:
   a substrate having a first surface and a second surface;
   a light detecting element in said substrate at the first surface;
   a light emitting element bonded to the first surface of said substrate for emitting light in a direction substantially parallel to the first surface; and
   a reflector bonded to the first surface of said substrate and reflecting the light emitted from said light emitting element from the direction substantially parallel to the first surface to a direction substantially perpendicular to the first surface of said substrate, wherein said reflector is monocrystalline Si and comprises a bottom face and a reflecting surface inclined at an angle of 45° with respect to the bottom face.

2. The optical semiconductor device according to claim 1, wherein the reflecting surface is a {111} plane of the monocrystalline Si reflector.

3. The optical semiconductor device according to claim 2, wherein said reflector includes a top face parallel to the bottom face, the top face having a planar surface with a C shape, the reflecting surface adjoining an inner edge of the top face, and two etched side surfaces adjacent to two sides of the reflecting surface.

4. The optical semiconductor device according to claim 2, wherein said reflector has a first side and a second side, the reflecting surface is on the first side, and the second side forms an angle of 63° with the bottom face.

5. The optical semiconductor device according to claim 2, wherein the bottom face is 9.7° off a <110> direction of the monocrystalline Si with respect to a {100} plane of the monocrystalline Si reflector.

6. The optical semiconductor device according to claim 5, wherein said reflector includes a top face parallel to the bottom face and an edge where the reflecting surface and one of the top face and the bottom face join, the edge being within 5° of a <110> direction that is perpendicular the <110> direction from which the bottom surface forms the 9.7° angle.

7. The optical semiconductor device according to claim 2, wherein said light emitting element has a power output less than 10 mW or a characteristic temperature $T_0$ of at least 90°.

8. The optical semiconductor device according to claim 1, wherein the bottom face is a {111} plane of the monocrystalline Si reflector.

9. The optical semiconductor device according to claim 8, wherein one side surface of the reflector is the bottom face and another side surface of the reflector forms an angle of 63° with the first surface of the substrate.

10. The optical semiconductor device according to claim 8, wherein the reflecting surface is a surface of the monocrystalline Si reflector 9.7° off a <110> direction of the monocrystalline Si reflector with respect to the {100} plane of the monocrystalline Si reflector.

11. An optical semiconductor device comprising:

a substrate having a first surface and a second surface;

a light detecting element in said substrate at the first surface;

a reflector mounted on the first surface of said substrate for reflecting light, wherein said reflector is monocrystalline Si and includes a bottom face, a reflecting surface inclined at an angle of 45° with respect to the bottom face, and a stepped face parallel to the bottom face and adjacent to the reflecting surface, the bottom face of said reflector being bonded to the first surface of said substrate; and a light emitting element bonded to the stepped face of said reflector and emitting light in a direction substantially parallel to the stepped surface.

12. The optical semiconductor device according to claim 11, wherein the reflecting surface is a {111} plane of the monocrystalline Si reflector.

* * * * *